US012155391B2

(12) United States Patent
Wijetunga et al.

(10) Patent No.: US 12,155,391 B2
(45) Date of Patent: Nov. 26, 2024

(54) CLOCK BUFFER

(71) Applicant: Rambus Inc., San Jose, CA (US)

(72) Inventors: Panduka Wijetunga, Thousand Oaks, CA (US); Catherine Chen, Cupertino, CA (US)

(73) Assignee: Rambus, Inc., San Jose, CA (US)

( * ) Notice: Subject to any disclaimer, the term of this patent is extended or adjusted under 35 U.S.C. 154(b) by 3 days.

(21) Appl. No.: 18/070,713

(22) Filed: Nov. 29, 2022

(65) Prior Publication Data

US 2023/0188145 A1 Jun. 15, 2023

Related U.S. Application Data

(60) Provisional application No. 63/287,708, filed on Dec. 9, 2021.

(51) Int. Cl.
*H03L 7/081* (2006.01)
*H03L 7/097* (2006.01)

(52) U.S. Cl.
CPC .......... *H03L 7/0814* (2013.01); *H03L 7/0816* (2013.01); *H03L 7/097* (2013.01)

(58) Field of Classification Search
CPC ..... H03L 7/00; H03L 7/06; H03L 7/08; H03L 7/081; H03L 7/0812; H03L 7/0814; H03L 7/0816; H03L 7/0818; H03L 7/085; H03K 5/13; H03K 5/133; H03K 5/131; H03K 5/134; H03K 5/135; H03K 5/14
See application file for complete search history.

(56) References Cited

U.S. PATENT DOCUMENTS

| 6,501,312 | B1 | 12/2002 | Nguyen |
| 6,636,979 | B1 | 10/2003 | Reddy et al. |
| 6,720,810 | B1* | 4/2004 | New ............... H03K 5/135 327/158 |
| 6,748,549 | B1 | 6/2004 | Chao et al. |
| 6,891,415 | B2 | 5/2005 | Mikhaley et al. |
| 7,039,147 | B2 | 5/2006 | Donnelly et al. |
| 7,185,301 | B2* | 2/2007 | Hao ............... G11C 5/025 716/134 |
| 7,570,542 | B2 | 8/2009 | Lee |
| 9,467,133 | B2* | 10/2016 | Chong ............ H03K 5/2481 |
| 2007/0086555 | A1 | 4/2007 | Cho |
| 2011/0248752 | A1 | 10/2011 | Willey et al. |

OTHER PUBLICATIONS

Renesas, "EEPROM Programmable 2.5V Programmable Skew PLL Clock Driver", IDT5T9890, Renesas Electronic Corporation, Mar. 2009, 38 pages.
Renesas, "System Applications and Design Guidelines with IDT's Zero-Delay Buffers", Rev B 091013, Renesas Electronics Corporation, 2019, 12 pages.

* cited by examiner

*Primary Examiner* — Diana J. Cheng
(74) *Attorney, Agent, or Firm* — The Neudeck Law Firm, LLC

(57) ABSTRACT

A phase-locked loop or delay locked loop provides a coarse alignment between an input clock and an output clock. A latch receiver circuit provides an indicator of a delay error between the input clock and the output clock. The delay error is used by a control circuit or state machine to adjust a fine delay that affects the output clock signal timing relative to the input clock signal. The fine delay is adjusted to minimize the timing difference between the output clock signal and the input clock signal.

20 Claims, 9 Drawing Sheets

CLOCK BUFFER

DETAILED DESCRIPTION OF THE EMBODIMENTS

In an embodiment, a clock buffer integrated circuit includes a phase-locked loop or delay locked loop that provides a coarse alignment between an input clock and an output clock. A latch receiver circuit provides an indicator of a delay error between the input clock and the output clock. The delay error is used by a control circuit or state machine to adjust a fine delay that affects the output clock signal timing relative to the input clock signal. The fine delay is adjusted to minimize the timing difference between the output clock signal and the input clock signal.

Figure 1A:
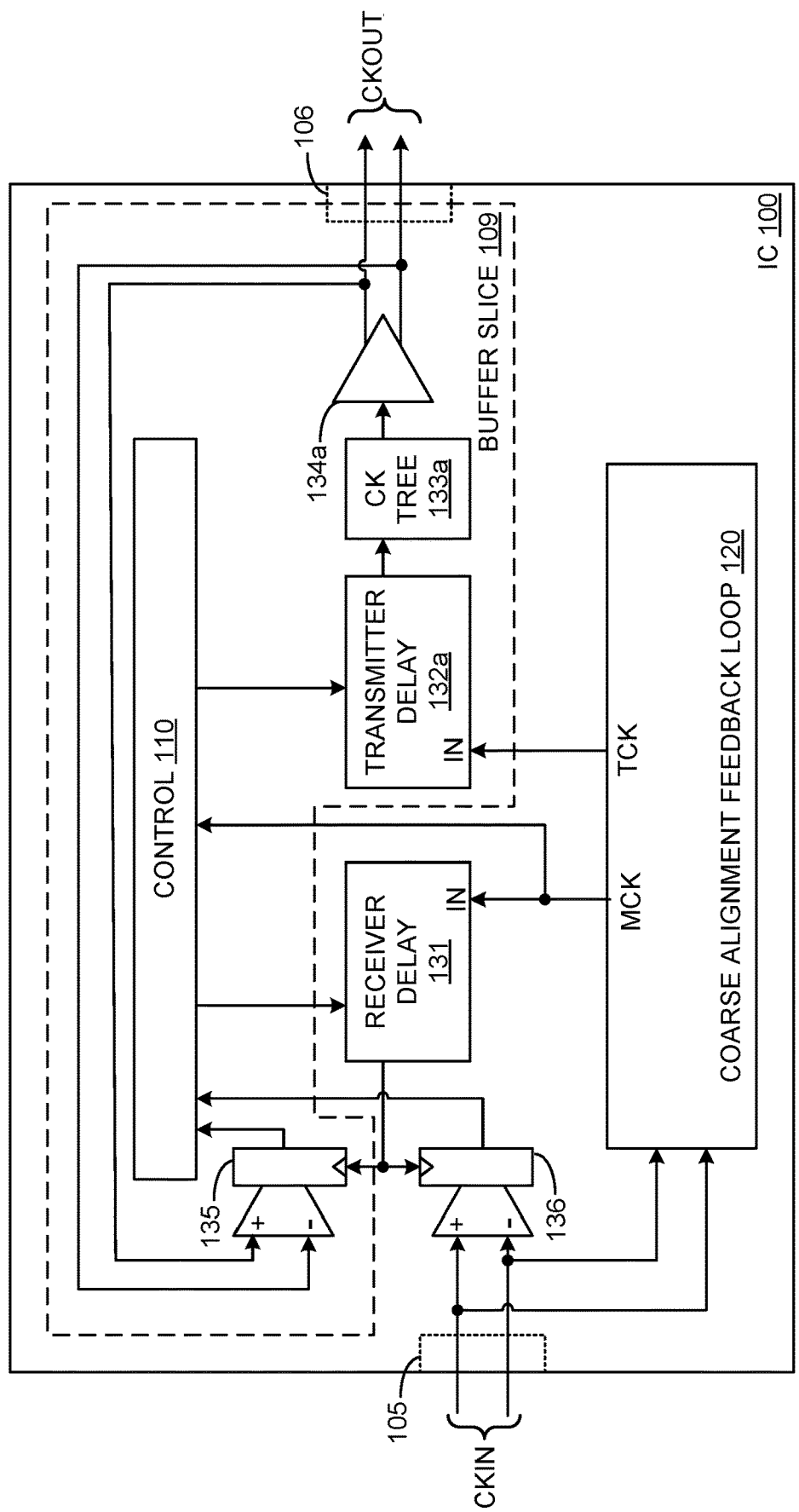
FIGS. 1A-1B are diagrams illustrating clock buffer integrated circuits.
Figure 1B:
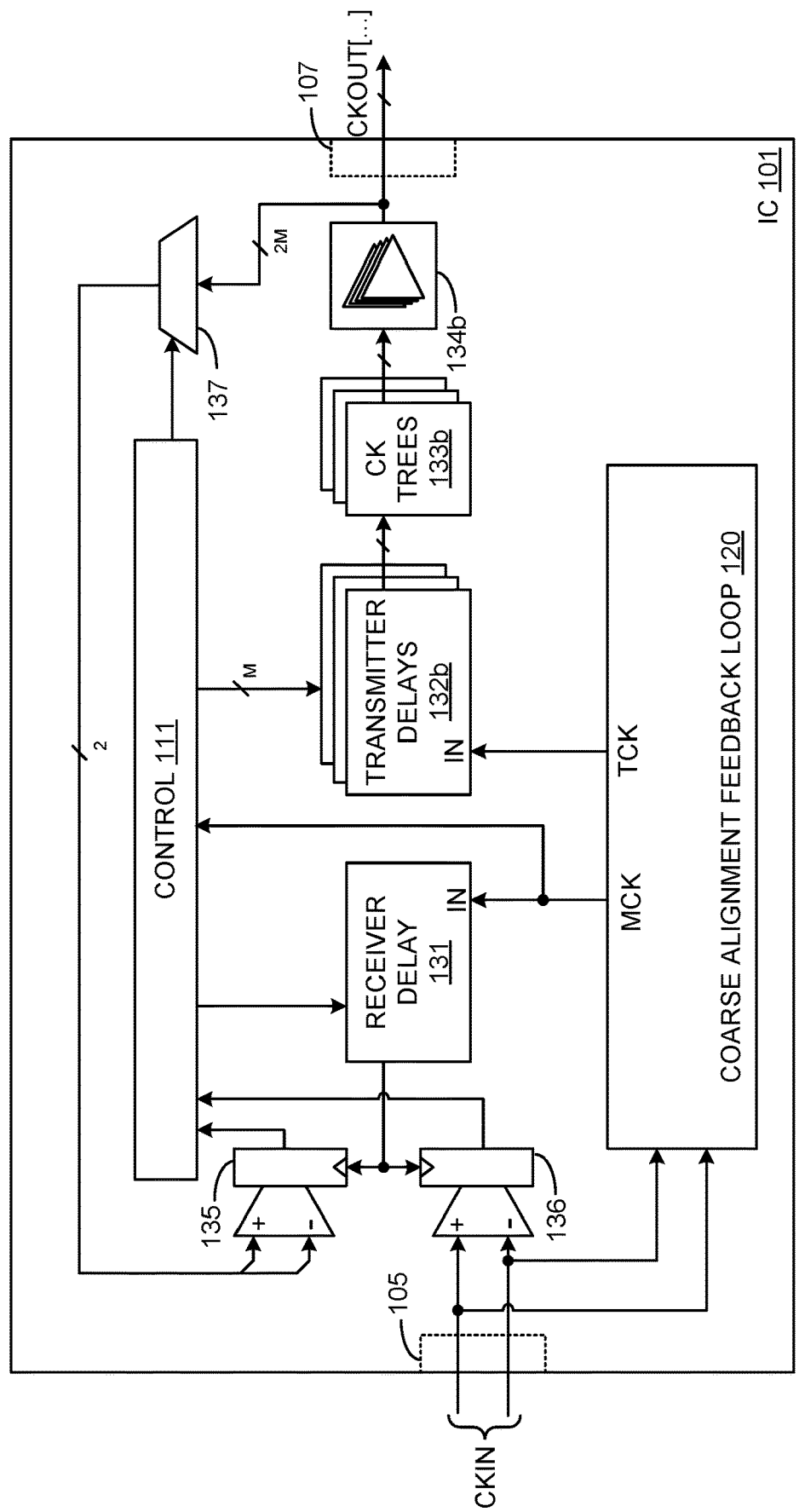

FIGS. 1A-1B are diagrams illustrating clock buffer integrated circuits. In FIG. 1A, integrated circuit 100 comprises clock input interface 105, clock output interface 106, control 110, coarse alignment feedback loop 120, receiver delay 131, transmitter delay 132a, clock tree 133a, clock transmitter 134a, latch receiver 135, and latch receiver 136. Transmitter delay 132a, clock tree 133a, clock transmitter 134a, latch receiver 135, and at least a portion of control 110 and clock output interface 106, are included in buffer slice 109. Buffer slice 109 represents circuitry that may be duplicated or repeated in order to provide additional copies of the clock signal (CKOUT) being buffered/transmitted.

A differential input clock signal (CKIN) is received via clock input interface 105 and provided to coarse alignment feedback loop 120 and latch receiver 136. The output of latch receiver 136 is provided to control 110. Based on the input clock signal CKIN, coarse alignment feedback loop 120 produces two clock signals that are at the same frequency as the input clock signal CKIN: a matched delay clock (MCK) and a raw synthesized clock (TCK). Raw synthesized clock TCK provides a coarse alignment of CKIN to CKOUT.

Coarse alignment feedback loop 120 may be configured as a delay-locked loop (DLL) or phase-locked loop (PLL) that is tapped a different points to produce MCK and TCK. For example, the feedback loop of coarse alignment feedback loop 120 may include delay elements matched to the delays (e.g., transmitter delay 132a, clock tree 133a, clock transmitter 134a) in buffer slices 109. MCK may be produced by tapping a clock signal at a node that includes one or more of the matched delays. TCK may be produced, for example, by tapping a synthesized (e.g., by a voltage controlled oscillator or controllable delay element) clock signal without including one or more of the matched delays. In an embodiment, coarse alignment feedback loop 120 with delays matched to buffer slices 109 may achieve 10-15 ps accuracies in matching an output to input clock CKIN.

MCK is provided to the input of receiver delay 131 and control 110. The output of receiver delay 131 is a delayed version of MCK. The amount of delay from the input of receiver delay 131 to the output of receiver delay 131 is controlled by control 110. The delayed version of MCK from receiver delay 131 is provided to the clock inputs of latch receiver 135 and latch receiver 136. In an embodiment, latch receiver 135 and latch receiver 136 are strong-arm flip-flop differential receiver circuits.

Control 110 adjusts the amount of delay through receiver delay 131 such that the timing difference between the transitions of the CKIN signal at latch receiver 136's input and the transitions of the delayed MCK signal at latch receiver 136's clock input are minimized. The minimized difference between the CKIN transitions and the delay MCK transitions may be, for example, in the 0-1 ps range.

TCK is provided to the input of transmitter delay 132a. The output of transmitter delay 132a is a delayed version of TCK. The amount of delay from the input of transmitter delay 132a to the output of transmitter delay 132a is controlled by control 110. The delayed version of TCK from transmitter delay 132a is provided to the input of clock tree 133a. The output of clock tree 133a is provided to the input of clock transmitter 134a. The output of clock transmitter 134a is transmitted out of integrated circuit 100 via clock output interface 106. The output of clock transmitter 134a is also provided to the input of latch receiver 135. The output of latch receiver 135 is provided to control 110.

Control 110 adjusts the amount of delay through transmitter delay 132a such that the timing difference between the transitions of the CKOUT signal at latch receiver 135's input and the transitions of the delayed MCK signal at latch receiver 135's clock input are minimized. It should be understood that transmitter delay 132a, clock tree 133a, clock transmitter 134a, latch receiver 135, and control 110 form a feedback loop configured to minimize the difference between the transitions of the CKOUT signal at latch receiver 135's input and the transitions of the delayed MCK signal at latch receiver 135's clock input. The minimized difference between the CKIN transitions and the delay MCK transitions may be, for example, in the 0-1 ps range. The minimized difference between the CKIN transitions and the delay MCK transitions may be limited by the metastability region of latch receiver 135 and the delay adjustment step size of transmitter delay 132a.

In FIG. 1B, integrated circuit 101 comprises clock input interface 105, clock output interface 107, control 111, coarse alignment feedback loop 120, receiver delay 131, transmitter delays 132b, clock trees 133b, clock transmitters 134b, latch receiver 135, latch receiver 136, and 2*M to 2 multiplexer 137. It should be understood from FIG. 1B that integrated circuit 101 operates similarly to integrated circuit 100 but is shown outputting M number of differential clock signals via clock output interface 107. Multiplexer 137 is used by control 110 to provide individual ones of the M output clock signals (CKOUT[ . . . ]) to the input of latch receiver 135 so that corresponding individual ones of transmitter delays 132b may be adjusted to minimize the timing difference between transitions on MCK and the selected one of the output clock signals in the manner described herein with respect to FIG. 1A. Thus, for the sake of brevity, that discussion will not be repeated here.

Figure 2A:
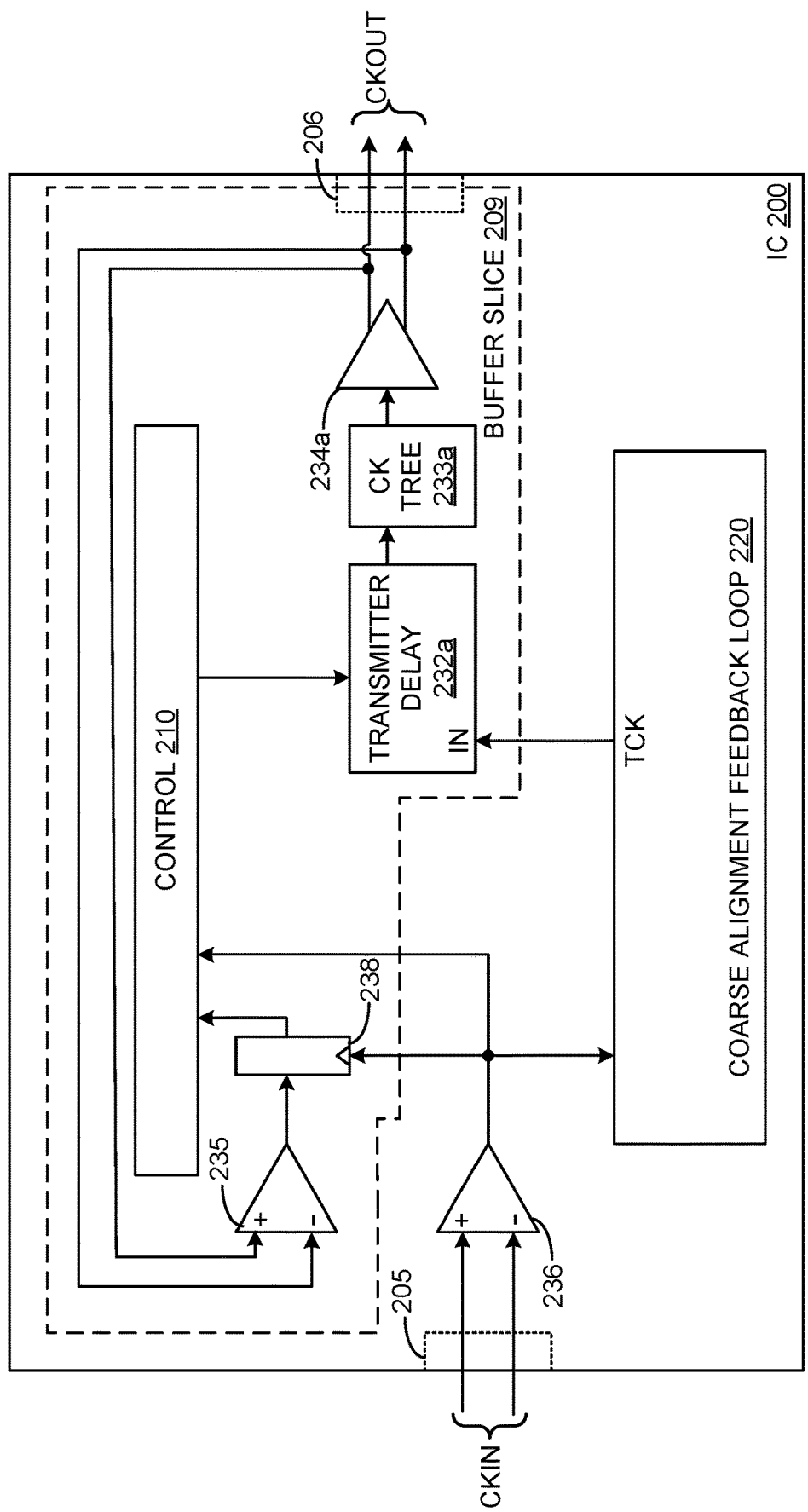
FIGS. 2A-2B are diagrams illustrating clock buffer integrated circuits.
Figure 2B:
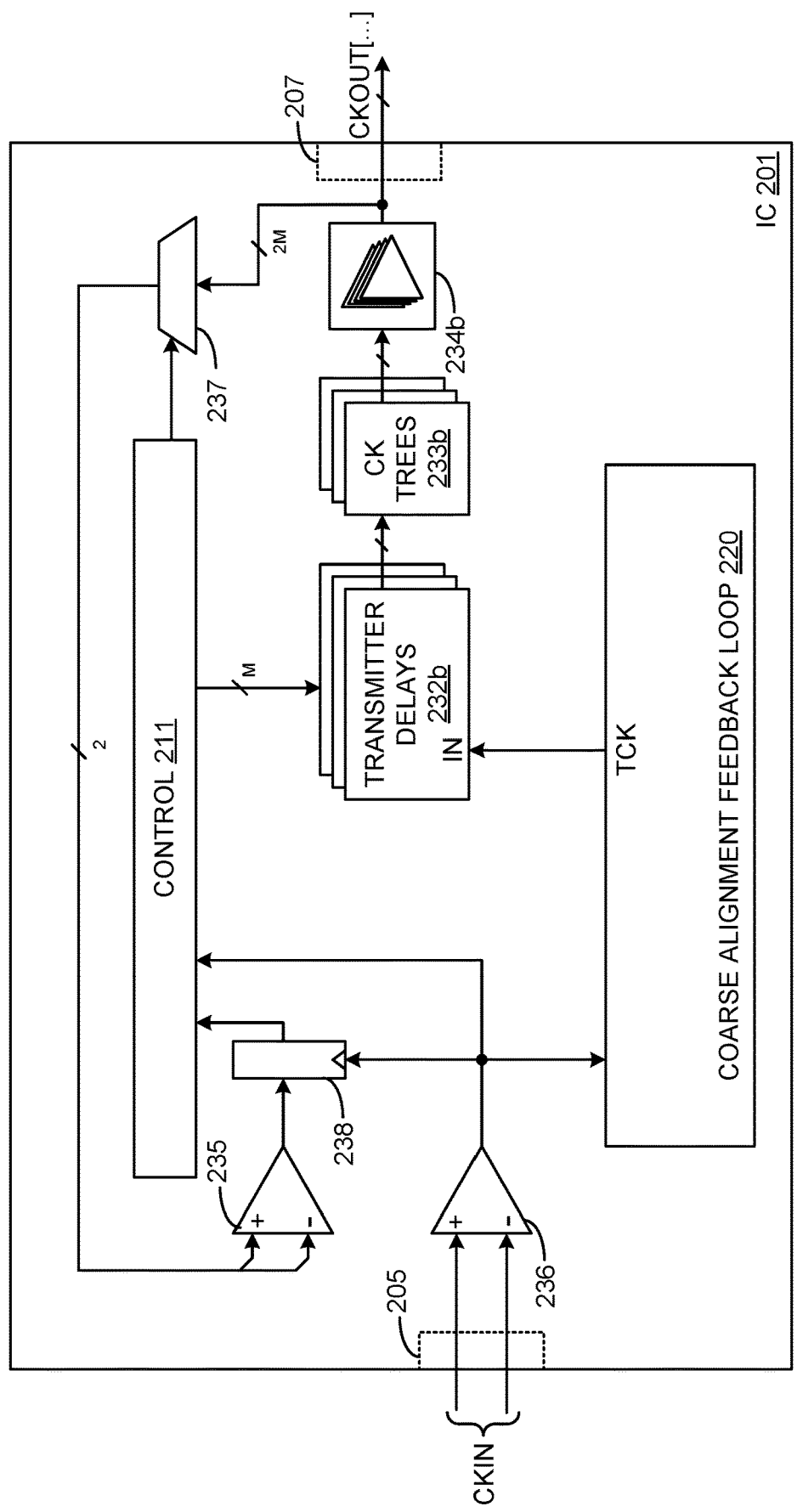

FIGS. 2A-2B are diagrams illustrating clock buffer integrated circuits. In FIG. 2A, integrated circuit 200 comprises clock input interface 205, clock output interface 206, control 210, coarse alignment feedback loop 220, transmitter delay 232a, clock tree 233a, clock transmitter 234a, differential receiver 235, differential receiver 236, and D flip-flop (a.k.a., a latch) 238. Transmitter delay 232a, clock tree 233a, clock transmitter 234a, differential receiver 235, flip-flop 238, and at least a portion of control 210 and clock output interface 206, are included in buffer slice 209. Buffer slice 209 represents circuitry that may be duplicated or repeated in order to provide additional copies of the clock signal (CKOUT) being buffered/transmitted.

A differential input clock signal (CKIN) is received via clock input interface 205 and differential receiver 236. The output of differential receiver 236 is provided to control 210, coarse alignment feedback loop 220, and the clock input of flip-flop 238. Based on the received clock signal, coarse alignment feedback loop 220 produces a clock signal (TCK) that is at the same frequency as the input clock signal CKIN. TCK provides a coarse alignment of CKIN to CKOUT.

Coarse alignment feedback loop 220 may be configured as a phase-locked loop (PLL) that is tapped a point in its feedback loop to produce TCK. For example, the feedback loop of coarse alignment feedback loop 220 may include delay elements matched to the delays (e.g., transmitter delay 232a, clock tree 233a, clock transmitter 234a) in buffer slices 209. TCK may be produced, for example, by tapping a synthesized (e.g., by a voltage controlled oscillator) clock signal without including one or more of the matched delays.

TCK is provided to the input of transmitter delay 232a. The output of transmitter delay 232a is a delayed version of TCK. The amount of delay from the input of transmitter delay 232a to the output of transmitter delay 232a is controlled by control 210. The delayed version of TCK from transmitter delay 232a is provided to the input of clock tree 233a. The output of clock tree 233a is provided to the input of clock transmitter 234a. The output of clock transmitter 234a is transmitted out of integrated circuit 200 via clock output interface 206. The output of clock transmitter 234a is also provided to the input of differential receiver 235. The output of differential receiver 235 is provided to the data input of flip-flop 238. The output of flip-flop 238 is provided to control 210.

Control 210 adjusts the amount of delay through transmitter delay 232a such that the timing difference between the transitions of the signal at flip-flop 238's data input and the transitions of the output of differential receiver 236 at flip-flop 238's clock input are minimized. It should be understood that transmitter delay 232a, clock tree 233a, clock transmitter 234a, differential receiver 235, flip-flop 238, and control 110 form a feedback loop configured to minimize the difference between the transitions of the signal at flip-flop 238's data input and the transitions of the received CKIN signal the output of differential receiver 236 (and clock input of flip-flop 238).

In FIG. 2B, integrated circuit 201 comprises clock input interface 205, clock output interface 207, control 211, coarse alignment feedback loop 220, transmitter delays 232b, clock trees 233b, clock transmitters 234b, differential receiver 235, differential receiver 236, and 2M to 2 multiplexor 237. It should be understood from FIG. 2B that integrated circuit 101 operates similarly to integrated circuit 200 but is shown outputting M number of differential clock signals via clock output interface 207. Multiplexor 237 is used by control 210 to provide individual ones of the M output clock signals (CKOUT[ . . . ]) to the input of differential receiver 235 so that corresponding individual ones of transmitter delays 232b may be adjusted to minimize the timing difference the timing difference between the transitions of the selected signal at flip-flop 238's data input and the transitions of the output of differential receiver 236 at flip-flop 238's clock input in the manner described herein with respect to FIG. 2A. Thus, for the sake of brevity, that discussion will not be repeated here.

Figure 3:
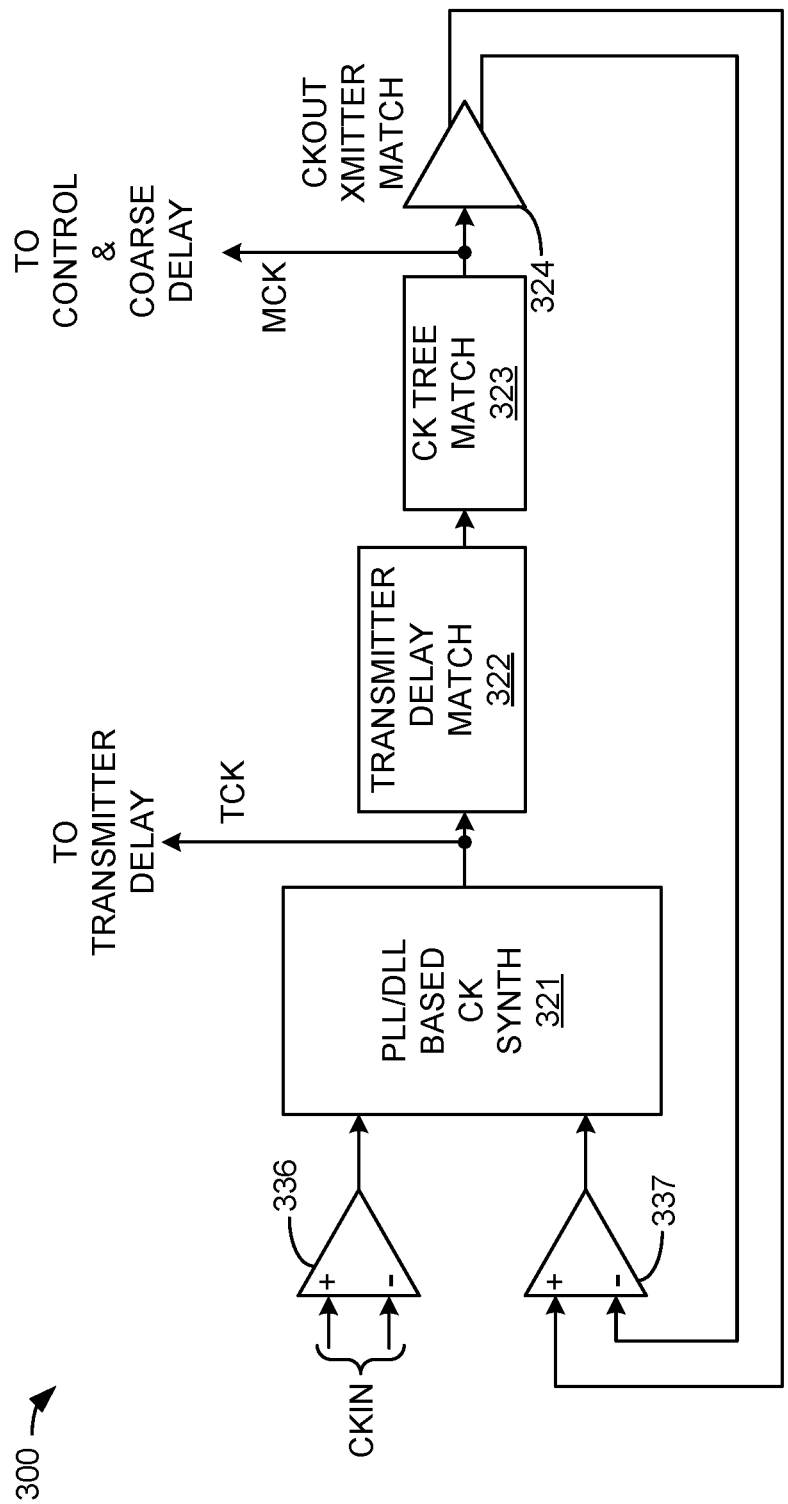
FIG. 3 is a diagram illustrating a coarse alignment feedback loop.

FIG. 3 is a diagram illustrating a coarse alignment feedback loop. In FIG. 3, coarse alignment feedback loop 300 comprises differential receiver 336, clock synthesizer 321, transmitter delay matching 322, clock tree matching 323, clock transmitter matching 324, and differential receiver 337. Coarse alignment feedback loop 300 is an example of coarse alignment feedback loop 120. The output of clock synthesizer 321 is output by coarse alignment feedback loop 300 for provision to the input of a fine adjustable delay element (e.g., transmitter delay 132a and/or transmitter delays 132b). The output of clock tree matching is output by coarse alignment feedback loop 300 for provision to the input of a coarse adjustable delay element (e.g., receiver delay 131).

Differential receiver 336 receives an input clock signal CKIN and provides the received input clock signal to clock synthesizer 321. In an embodiment, clock synthesizer 321 may comprise components of a phase-locked loop (PLL) circuit. For example, clock synthesizer 321 may comprise a phase detector, filter circuitry (e.g., proportional-integral-derivative—PID circuitry or function), and a voltage controlled oscillator. In an embodiment, clock synthesizer 321 may comprise components of a delay-locked loop (DLL) circuit. For example, clock synthesizer 321 may comprise a phase detector, filter circuitry (e.g., PID circuitry or function), and a controllable delay element.

The output of clock synthesizer 321 is provided to the input of transmitter delay matching 322. Transmitter delay matching 322 may be configured to have a fixed delay that matches or approximates the delay of controllable fine delay elements (e.g., transmitter delay 132a and/or transmitter delays 132b). The output of fine delay match 322 is provided to clock tree matching 323. Clock tree matching 323 may be configured to have a delay that matches or approximates the delay of clock tree elements (e.g., clock tree 133a and/or clock trees 133b). The output of clock tree matching 323 is provided to the input of clock transmitter matching 324. Clock transmitter matching 324 may be configured to have a delay that matches or approximates the delay of clock transmitters (e.g., clock transmitter 134a and/or clock transmitters 134b). The output of clock transmitter matching 324 is provided to the input of differential receiver 337. Differential receiver 337 may be configured to have a delay that matches or approximates the delay of differential receiver 336. The output of differential receiver 337 is provided to clock synthesizer 321.

It should be understood from the foregoing that the elements illustrated in FIG. 3 form a feedback loop that aligns the transitions at the output of differential receiver 337 with the transitions of the clock signal at the output of differential receiver 336. Thus, coarse alignment feedback loop 300 may be viewed as a delay-locked loop when clock synthesizer 321 includes a controllable delay element or may be viewed as a phase-locked loop when clock synthesizer 321 includes a controllable oscillator element.

Figure 4:
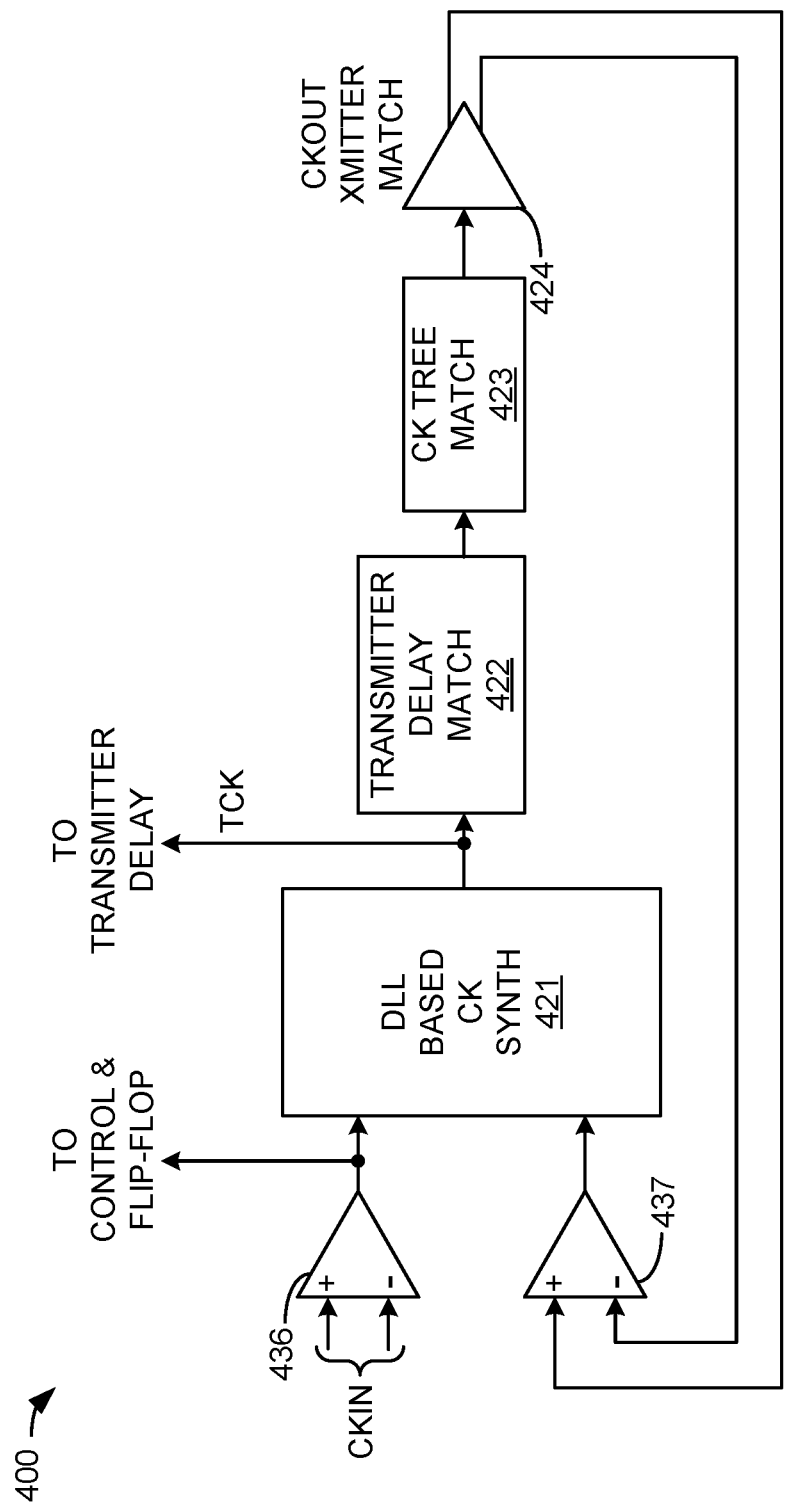
FIG. 4 is a diagram illustrating a coarse alignment feedback loop.

FIG. 4 is a diagram illustrating a coarse alignment feedback loop. In FIG. 4, coarse alignment feedback loop 400 comprises differential receiver 436, clock synthesizer 421, transmitter delay matching 422, clock tree matching 423, clock transmitter matching 424, and differential receiver 437. Coarse alignment feedback loop 400 is an example of coarse alignment feedback loop 220. The output of clock synthesizer 421 is output by coarse alignment feedback loop 300 for provision to the input of a fine adjustable delay element (e.g., transmitter delay 232a and/or transmitter delays 232b). The output of differential receiver 436 is output by coarse alignment feedback loop 400 for provision to the clock input of a flip-flop (e.g., flip-flop 238) and control circuitry (e.g., control 210 and/or control 211).

Differential receiver 436 receives an input clock signal CKIN and provides the received input clock signal to clock synthesizer 421. In an embodiment, clock synthesizer 321 may comprise components of a delay-locked loop (DLL) circuit. For example, clock synthesizer 421 may comprise a phase detector, filter circuitry (e.g., PID circuitry or function), and a controllable delay element.

The output of clock synthesizer 421 is provided to the input of transmitter delay matching 422. Transmitter delay matching 422 may be configured to have a fixed delay that matches or approximates the delay of controllable fine delay elements (e.g., transmitter delay 232a and/or transmitter delays 232b). The output of fine delay match 422 is provided to clock tree matching 423. Clock tree matching 423 may be configured to have a delay that matches or approximates the delay of clock tree elements (e.g., clock tree 233a and/or clock trees 233b). The output of clock tree matching 423 is provided to the input of clock transmitter matching 424. Clock transmitter matching 424 may be configured to have a delay that matches or approximates the delay of clock transmitters (e.g., clock transmitter 234a and/or clock transmitters 234b). The output of clock transmitter matching 424 is provided to the input of differential receiver 437. Differential receiver 437 may be configured to have a delay that matches or approximates the delay of differential receiver 436. The output of differential receiver 437 is provided to clock synthesizer 421.

It should be understood from the foregoing that the elements illustrated in FIG. 4 form a feedback loop that aligns the transitions at the output of differential receiver 437 with the transitions of the clock signal at the output of differential receiver 436. Thus, coarse alignment feedback loop 400 may be viewed as a delay-locked loop.

Figure 5:
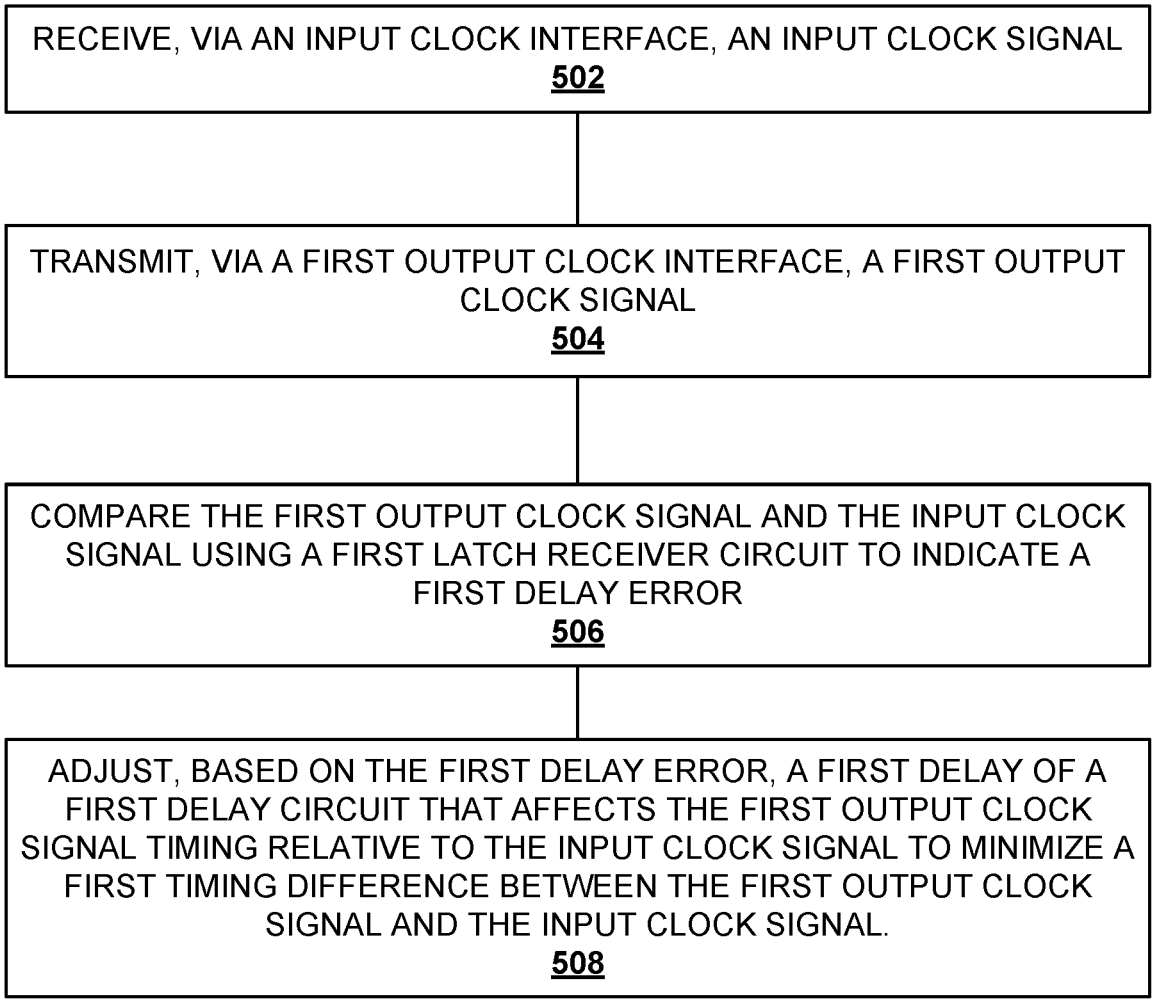
FIG. 5 is a flowchart illustrating a method of aligning a clock.

FIG. 5 is a flowchart illustrating a method of aligning a clock. One or more steps illustrated in FIG. 5 may be performed by, for example, integrated circuit 100, integrated circuit 101, integrated circuit 200, integrated circuit 201, feedback loop 300, feedback loop 400, and/or their components. Via an input clock interface, an input clock signal is received (502). For example, an input clock signal CKIN may be received by integrated circuit 100 via interface 105. In another example, an input clock signal CKIN may be received by integrated circuit 200 via interface 205.

Via a first output clock interface, a first output clock signal is transmitted (504). For example, an output clock signal CKOUT may be transmitted by integrated circuit 100 via interface 106. In another example, an output clock signal CKOUT may be transmitted by integrated circuit 200 via interface 206. The first output clock signal and the input clock signal are compared using a first latch receiver circuit to indicate a first delay error (506). For example, latch receiver 135 may compare the timing of an edge (e.g., rising edge) of the output of receiver delay 131 that triggers latch receiver 135 to the state of the CKOUT signal. In other words, for example, if the rising edge of CKOUT arrives at the input to latch receiver 135 before latch receiver 135 is triggered by the rising edge of the output of receiver delay 131, the output of latch receiver 135 will be a first value (e.g., logical "1"). If the rising edge of CKOUT arrives at the input to latch receiver 135 after latch receiver 135 is triggered by the rising edge of the output of receiver delay 131, the output of latch receiver 135 will be a second value (e.g., logical "0").

In another example, flip-flop 238 may compare the timing of an edge (e.g., rising edge) of the output of differential receiver 236 that triggers flip-flop 238 to the state of the output of differential receiver 235. In other words, for example, if the rising edge of CKOUT arrives at the input to flip-flop 238 before flip-flop 238 is triggered by the rising edge of the output of differential receiver 236, the output of flip-flop 238 will be a first value (e.g., logical "1"). If the rising edge of CKOUT arrives at the input to flip-flop 238 after flip-flop 238 is triggered by the rising edge of the output of differential receiver 236, the output of flip-flop 238 will be a second value (e.g., logical "0").

Based on the first delay error, a first delay of a first delay circuit that affects the first output clock signal timing relative to the input clock signal is adjusted to minimize a first timing difference between the first output clock signal and the input clock signal (508). For example, control 110 may adjust, based on the output received from latch receiver 135, the amount of delay provided by transmitter delay 132a to minimize the timing difference between CKIN and CKOUT (as measured by latch receiver 135). In another example, control 210 may adjust, based on the output received from flip-flop 238, the amount of delay provided by transmitter delay 232a to minimize the timing difference between CKIN and CKOUT (as measured by flip-flop 238).

Figure 6:
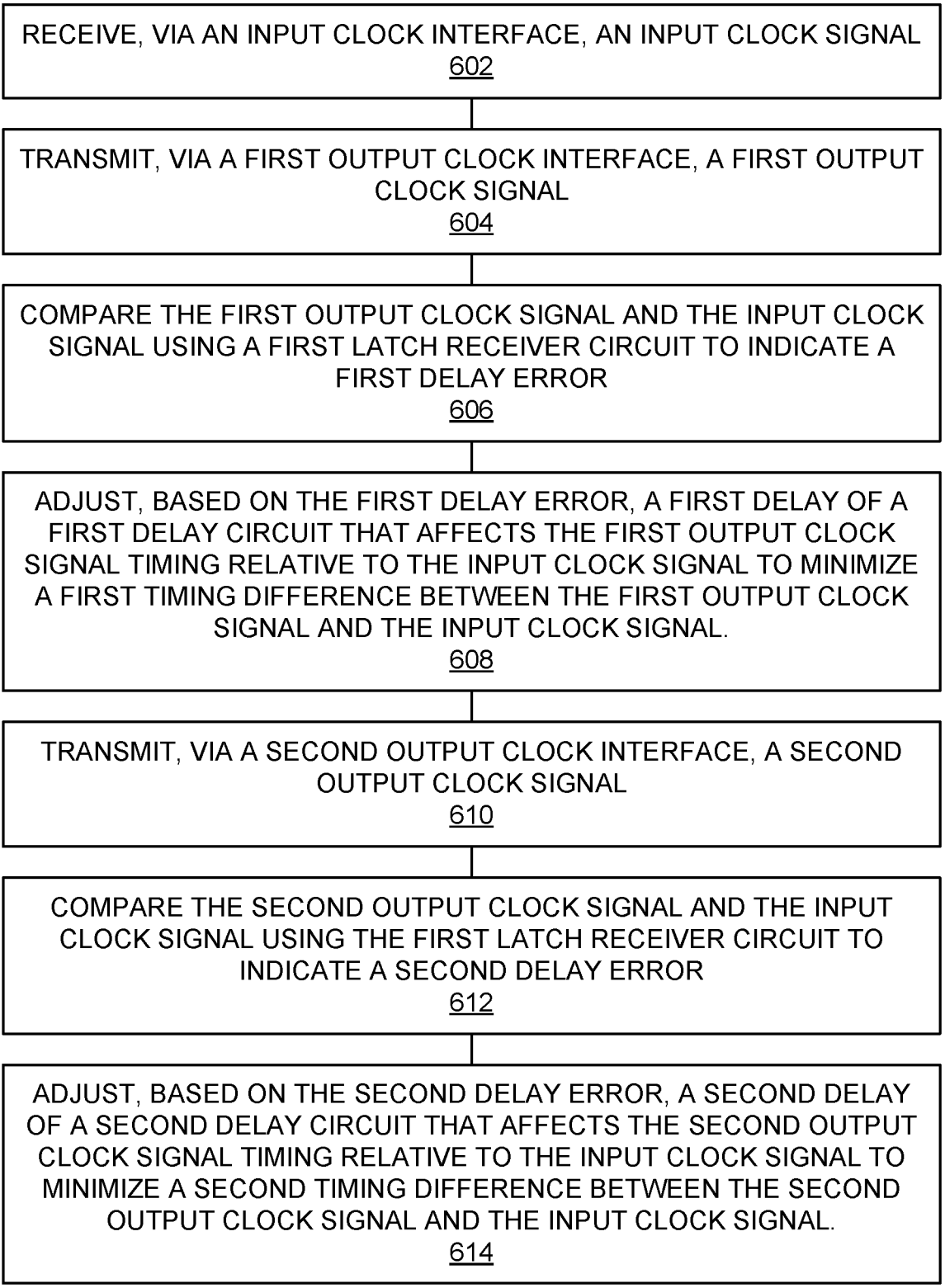
FIG. 6 is a flowchart illustrating a method of aligning multiple clocks.

FIG. 6 is a flowchart illustrating a method of aligning multiple clocks. One or more steps illustrated in FIG. 6 may be performed by, for example, integrated circuit 100, integrated circuit 101, integrated circuit 200, integrated circuit 201, feedback loop 300, feedback loop 400, and/or their components. Via an input clock interface, an input clock signal is received (602). For example, an input clock signal CKIN may be received by integrated circuit 100 via interface 105. In another example, an input clock signal CKIN may be received by integrated circuit 200 via interface 205.

Via a first output clock interface, a first output clock signal is transmitted (604). For example, a first output clock signal CKOUT[0] may be transmitted by integrated circuit 101 via interface 107. In another example, a first output clock signal CKOUT[0] may be transmitted by integrated circuit 201 via interface 207. The first output clock signal and the input clock signal are compared using a first latch receiver circuit to indicate a first delay error (606). For example, multiplexer 137 may provide latch receiver 135 with the first output clock signal CKOUT[0] and latch receiver 135 may compare the timing of an edge (e.g., rising edge) of the output of receiver delay 131 that triggers latch receiver 135 to the state of the CKOUT[0] signal. In other words, for example, if the rising edge of CKOUT[0] arrives at the input to latch receiver 135 before latch receiver 135 is triggered by the rising edge of the output of receiver delay 131, the output of latch receiver 135 will be a first value (e.g., logical "1"). If the rising edge of CKOUT[0] arrives at the input to latch receiver 135 after latch receiver 135 is triggered by the rising edge of the output of receiver delay 131, the output of latch receiver 135 will be a second value (e.g., logical "0").

In another example, multiplexer 137 may provide differential receiver 235 with the first output clock signal CKOUT[0] and flip-flop 238 may compare the timing of an edge (e.g., rising edge) of the output of differential receiver 236 that triggers flip-flop 238 to the state of the output of differential receiver 235. In other words, for example, if the rising edge of CKOUT[0] arrives at the input to flip-flop 238 before flip-flop 238 is triggered by the rising edge of the output of differential receiver 236, the output of flip-flop 238 will be a first value (e.g., logical "1"). If the rising edge of CKOUT[0] arrives at the input to flip-flop 238 after flip-flop 238 is triggered by the rising edge of the output of differential receiver 236, the output of flip-flop 238 will be a second value (e.g., logical "0").

Based on the first delay error, a first delay of a first delay circuit that affects the first output clock signal timing relative to the input clock signal is adjusted to minimize a first timing difference between the first output clock signal and the input clock signal (608). For example, control 111 may adjust, based on the output received from latch receiver 135, the amount of delay provided by corresponding one of transmitter delays 132b to minimize the timing difference between CKIN and CKOUT[0] (as measured by latch receiver 135). In another example, control 211 may adjust, based on the output received from flip-flop 238, the amount of delay provided by corresponding one of transmitter delays 232b to minimize the timing difference between CKIN and CKOUT[0] (as measured by flip-flop 238).

Via the first output clock interface, a second output clock signal is transmitted (610). For example, a second output clock signal CKOUT[1] may be transmitted by integrated circuit 101 via interface 107. In another example, a second output clock signal CKOUT[1] may be transmitted by integrated circuit 201 via interface 207. The second output clock signal and the input clock signal are compared using the first latch receiver circuit to indicate a first delay error (612). For example, multiplexer 137 may provide latch receiver 135 with the second output clock signal CKOUT[1] and latch receiver 135 may compare the timing of an edge (e.g., rising edge) of the output of receiver delay 131 that triggers latch receiver 135 to the state of the CKOUT[1] signal. In other words, for example, if the rising edge of CKOUT[1] arrives at the input to latch receiver 135 before latch receiver 135 is triggered by the rising edge of the output of receiver delay 131, the output of latch receiver 135 will be a first value (e.g., logical "1"). If the rising edge of CKOUT[1] arrives at the input to latch receiver 135 after latch receiver 135 is triggered by the rising edge of the output of receiver delay 131, the output of latch receiver 135 will be a second value (e.g., logical "0").

In another example, multiplexer 137 may provide differential receiver 235 with the second output clock signal CKOUT[1] and flip-flop 238 may compare the timing of an edge (e.g., rising edge) of the output of differential receiver 236 that triggers flip-flop 238 to the state of the output of differential receiver 235. In other words, for example, if the rising edge of CKOUT[1] arrives at the input to flip-flop 238 before flip-flop 238 is triggered by the rising edge of the output of differential receiver 236, the output of flip-flop 238 will be a first value (e.g., logical "1"). If the rising edge of CKOUT[1] arrives at the input to flip-flop 238 after flip-flop 238 is triggered by the rising edge of the output of differential receiver 236, the output of flip-flop 238 will be a second value (e.g., logical "0").

Based on the second delay error, a second delay of a second delay circuit that affects the second output clock signal timing relative to the input clock signal is adjusted to minimize a second timing difference between the second output clock signal and the input clock signal (614). For example, control 111 may adjust, based on the output received from latch receiver 135, the amount of delay provided by corresponding one of transmitter delays 132b to minimize the timing difference between CKIN and CKOUT[0] (as measured by latch receiver 135). In another example, control 211 may adjust, based on the output received from flip-flop 238, the amount of delay provided by a corresponding one of transmitter delays 232b to minimize the timing difference between CKIN and CKOUT[1] (as measured by flip-flop 238).

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of integrated circuit 100, integrated circuit 101, integrated circuit 200, integrated circuit 201, feedback loop 300, feedback loop 400, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 7:
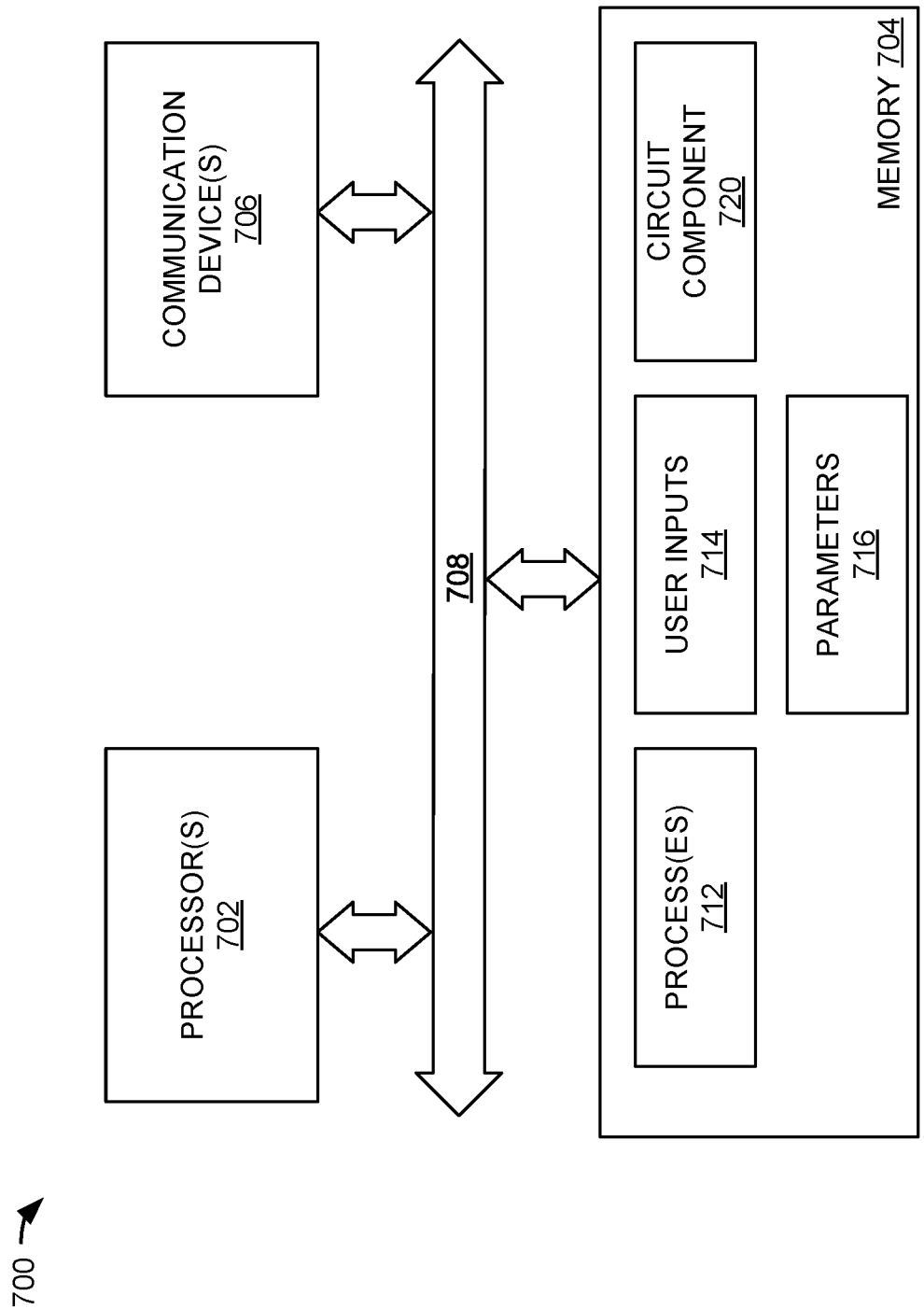
FIG. 7 is a block diagram of a processing system.

FIG. 7 is a block diagram illustrating one embodiment of a processing system 700 for including, processing, or generating, a representation of a circuit component 720. Processing system 700 includes one or more processors 702, a memory 704, and one or more communications devices 706. Processors 702, memory 704, and communications devices 706 communicate using any suitable type, number, and/or configuration of wired and/or wireless connections 708.

Processors 702 execute instructions of one or more processes 712 stored in a memory 704 to process and/or generate circuit component 720 responsive to user inputs 714 and parameters 716. Processes 712 may be any suitable electronic design automation (EDA) tool or portion thereof used to design, simulate, analyze, and/or verify electronic circuitry and/or generate photomasks for electronic circuitry. Representation 720 includes data that describes all or portions of integrated circuit 100, integrated circuit 101, integrated circuit 200, integrated circuit 201, feedback loop 300, feedback loop 400, and their components, as shown in the Figures.

Representation 720 may include one or more of behavioral, register transfer, logic component, transistor, and layout geometry-level descriptions. Moreover, representation 720 may be stored on storage media or communicated by carrier waves.

Data formats in which representation 720 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 714 may comprise input parameters from a keyboard, mouse, voice recognition interface, microphone and speakers, graphical display, touch screen, or other type of user interface device. This user interface may be distributed among multiple interface devices. Parameters 716 may include specifications and/or characteristics that are input to help define representation 720. For example, parameters 716 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 704 includes any suitable type, number, and/or configuration of non-transitory computer-readable storage media that stores processes 712, user inputs 714, parameters 716, and circuit component 720.

Communications devices 706 include any suitable type, number, and/or configuration of wired and/or wireless devices that transmit information from processing system 700 to another processing or storage system (not shown) and/or receive information from another processing or storage system (not shown). For example, communications devices 706 may transmit circuit component 720 to another system. Communications devices 706 may receive processes 712, user inputs 714, parameters 716, and/or circuit component 720 and cause processes 712, user inputs 714, parameters 716, and/or circuit component 720 to be stored in memory 704.

Implementations discussed herein include, but are not limited to, the following examples:

Example 1: An integrated circuit, comprising: an input clock interface to receive an input clock signal; a first output clock interface to transmit a first output clock signal that is aligned with the input clock signal; a first latch receiver circuit to indicate a first delay error; and a first delay circuit having a first delay that affects the first output clock signal timing relative to the input clock signal, the first delay to be adjusted based on the first delay error.

Example 2: The integrated circuit of example 1, further comprising: a second output clock interface to transmit a second output clock signal that is aligned with the input clock signal; a second latch receiver circuit to indicate a second delay error; and a second delay circuit having a second delay that affects the second output clock signal timing relative to the input clock signal, the second delay to be adjusted based on the second delay error.

Example 3: The integrated circuit of claim 1, further comprising: multiplexing circuitry to provide a second output clock signal transmitted via a second output clock interface to the first latch receiver circuit, in response to the second output clock signal from the mulitplexing circuitry, the first latch receiver circuit to indicate a second delay error; and a second delay circuit having a second delay that affects the second output clock signal timing relative to the input clock signal, the second delay to be adjusted based on the second delay error.

Example 4: The integrated circuit of example 1, wherein the first delay is swept over a range to detect a transition on an output of first latch receiver that indicates the first delay is near a value that minimizes the first timing difference between the first output clock signal and the input clock signal.

Example 5: The integrated circuit of example 1, wherein the first latch receiver circuit comprises a strong arm latch.

Example 6: The integrated circuit of example 1, wherein the first latch receiver circuit comprises a differential receiver and a latch.

Example 7: The integrated circuit of example 1, further comprising a feedback loop that receives the input clock signal and, based on the input clock signal, synthesizes a coarse phase adjusted internal clock signal that is provided to the first delay circuit.

Example 8. An integrated circuit, comprising: a phase adjustment feedback loop to produce a first output signal that is locked to an input clock signal and a second output signal, the phase adjustment feedback loop to include delay elements that approximate output clock distribution and transmitter delays; a first delay circuit to receive the second output signal and to output, after a first delay that affects a first output clock signal timing relative to the input clock signal, a first delayed output signal that is coupled to a first output clock signal transmitter that outputs the first output clock signal; a first latch receiver circuit to provide a first delay error indicator of a first timing difference between the first output clock signal and the input clock signal; and first circuitry to receive the first delay error indicator and to, based on the first delay error indicator, adjust the first delay.

Example 9: The integrated circuit of example 8, wherein the phase adjustment feedback loop is configured as a delay-locked loop.

Example 10: The integrated circuit of example 8, wherein the phase adjustment feedback loop is configured as a phase-locked loop.

Example 11: The integrated circuit of example 8, further comprising: a second delay circuit to receive the second output signal and to output, after a second delay that affects a second output clock signal timing relative to the input clock signal, a second delayed output signal that is coupled to a second output clock signal transmitter that outputs the second output clock signal; a second latch receiver circuit to provide a second delay error indicator of a second timing difference between the second output clock signal and the input clock signal; and wherein the first circuitry is to receive the second delay error indicator and is to, based on the second delay error indicator, adjust the second delay.

Example 12: The integrated circuit of example 8, further comprising: a second delay circuit to receive the second output signal and to output, after a second delay that affects a second output clock signal timing relative to the input clock signal, a second delayed output signal that is coupled to a second output clock signal transmitter that outputs the second output clock signal; multiplexing circuitry to provide the second output clock signal to the first latch receiver circuit, the first latch receiver circuit to provide a second delay error indicator of a second timing difference between the second output clock signal and the input clock signal; and wherein the first circuitry is to receive the second delay error indicator and is to, based on the second delay error indicator, adjust the second delay.

Example 13: The integrated circuit of example 8, wherein the first latch receiver circuit comprises a strong arm latch.

Example 14: The integrated circuit of example 8, wherein the first latch receiver circuit comprises a differential receiver and a latch.

Example 15: A method, comprising: receiving, via an input clock interface, an input clock signal; transmitting, via a first output clock interface, a first output clock signal; comparing the first output clock signal and the input clock signal using a first latch receiver circuit to indicate a first delay error; and adjusting, based on the first delay error, a first delay of a first delay circuit that affects the first output clock signal timing relative to the input clock signal to minimize a first timing difference between the first output clock signal and the input clock signal.

Example 16: The method of example 15, further comprising: transmitting, via a second output clock interface, a second output clock signal; comparing the second output clock signal and the input clock signal using the first latch receiver circuit to indicate a second delay error; and adjusting, based on the second delay error, a second delay of a second delay circuit that affects the second output clock signal timing relative to the input clock signal to minimize a second timing difference between the second output clock signal and the input clock signal.

Example 17: The method of example 16, further comprising: providing the first output clock signal to the first latch receiver circuit; and providing the second output clock signal to the first latch receiver circuit.

Example 18: The method of example 15, wherein the first delay circuit receives a coarse output clock signal from a feedback loop that receives the input clock signal as a reference signal.

Example 19: The method of example 18, wherein the feedback loop forms a delay-locked loop.

Example 20: The method of example 18, wherein the feedback loop forms a phase-locked loop.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit, comprising:
    an input clock interface to receive an input clock signal;
    a first output clock interface to transmit a first output clock signal that is aligned with the input clock signal;
    a first latch receiver circuit to indicate a first delay error; and
    a first delay circuit having a first delay that affects the first output clock signal timing relative to the input clock signal, the first delay to be adjusted based on the first delay error.

2. The integrated circuit of claim 1, further comprising:
    a second output clock interface to transmit a second output clock signal that is aligned with the input clock signal;
    a second latch receiver circuit to indicate a second delay error; and
    a second delay circuit having a second delay that affects the second output clock signal timing relative to the input clock signal, the second delay to be adjusted based on the second delay error.

3. The integrated circuit of claim 1, further comprising:
    multiplexing circuitry to provide a second output clock signal transmitted via a second output clock interface to the first latch receiver circuit, in response to the second output clock signal from the mulitplexing circuitry, the first latch receiver circuit to indicate a second delay error; and
    a second delay circuit having a second delay that affects the second output clock signal timing relative to the input clock signal, the second delay to be adjusted based on the second delay error.

4. The integrated circuit of claim 1, wherein the first delay is swept over a range to detect a transition on an output of first latch receiver that indicates the first delay is near a value that minimizes the first timing difference between the first output clock signal and the input clock signal.

5. The integrated circuit of claim 1, wherein the first latch receiver circuit comprises a strong arm latch.

6. The integrated circuit of claim 1, wherein the first latch receiver circuit comprises a differential receiver and a latch.

7. The integrated circuit of claim 1, further comprising a feedback loop that receives the input clock signal and, based on the input clock signal, synthesizes a coarse phase adjusted internal clock signal that is provided to the first delay circuit.

8. An integrated circuit, comprising:
    a phase adjustment feedback loop to produce a first output signal that is locked to an input clock signal and a second output signal, the phase adjustment feedback loop to include delay elements that approximate output clock distribution and transmitter delays;
    a first delay circuit to receive the second output signal and to output, after a first delay that affects a first output clock signal timing relative to the input clock signal, a first delayed output signal that is coupled to a first output clock signal transmitter that outputs the first output clock signal;
    a first latch receiver circuit to provide a first delay error indicator of a first timing difference between the first output clock signal and the input clock signal; and
    first circuitry to receive the first delay error indicator and to, based on the first delay error indicator, adjust the first delay.

9. The integrated circuit of claim 8, wherein the phase adjustment feedback loop is configured as a delay-locked loop.

10. The integrated circuit of claim 8, wherein the phase adjustment feedback loop is configured as a phase-locked loop.

11. The integrated circuit of claim 8, further comprising:
    a second delay circuit to receive the second output signal and to output, after a second delay that affects a second output clock signal timing relative to the input clock signal, a second delayed output signal that is coupled to a second output clock signal transmitter that outputs the second output clock signal;
    a second latch receiver circuit to provide a second delay error indicator of a second timing difference between the second output clock signal and the input clock signal; and
    wherein the first circuitry is to receive the second delay error indicator and is to, based on the second delay error indicator, adjust the second delay.

12. The integrated circuit of claim 8, further comprising:
    a second delay circuit to receive the second output signal and to output, after a second delay that affects a second output clock signal timing relative to the input clock signal, a second delayed output signal that is coupled to a second output clock signal transmitter that outputs the second output clock signal;
    multiplexing circuitry to provide the second output clock signal to the first latch receiver circuit, the first latch receiver circuit to provide a second delay error indicator of a second timing difference between the second output clock signal and the input clock signal; and wherein the first circuitry is to receive the second delay error indicator and is to, based on the second delay error indicator, adjust the second delay.

13. The integrated circuit of claim 8, wherein the first latch receiver circuit comprises a strong arm latch.

14. The integrated circuit of claim 8, wherein the first latch receiver circuit comprises a differential receiver and a latch.

15. A method, comprising:
receiving, via an input clock interface, an input clock signal;
transmitting, via a first output clock interface, a first output clock signal;
comparing the first output clock signal and the input clock signal using a first latch receiver circuit to indicate a first delay error; and
adjusting, based on the first delay error, a first delay of a first delay circuit that affects the first output clock signal timing relative to the input clock signal to minimize a first timing difference between the first output clock signal and the input clock signal.

16. The method of claim 15, further comprising:
transmitting, via a second output clock interface, a second output clock signal;
comparing the second output clock signal and the input clock signal using the first latch receiver circuit to indicate a second delay error; and
adjusting, based on the second delay error, a second delay of a second delay circuit that affects the second output clock signal timing relative to the input clock signal to minimize a second timing difference between the second output clock signal and the input clock signal.

17. The method of claim 16, further comprising:
providing the first output clock signal to the first latch receiver circuit; and
providing the second output clock signal to the first latch receiver circuit.

18. The method of claim 15, wherein the first delay circuit receives a coarse output clock signal from a feedback loop that receives the input clock signal as a reference signal.

19. The method of claim 18, wherein the feedback loop forms a delay-locked loop.

20. The method of claim 18, wherein the feedback loop forms a phase-locked loop.

* * * * *